United States Patent
Anderson et al.

[19]

[11] Patent Number: 5,928,016
[45] Date of Patent: Jul. 27, 1999

[54] DIRECT ACCESS STORAGE DEVICE HOUSING AND TRAY DESIGN

[75] Inventors: Neil A. Anderson, Rochester; John L. Colbert, Byron; Steven D. Greseth, Rochester; Kyle J. Honadel, Rochester; Cal W. Johnson, Rochester, all of Minn.

[73] Assignee: International Business Machines Corporation, Armonk, N.Y.

[21] Appl. No.: 08/951,332

[22] Filed: Oct. 16, 1997

[51] Int. Cl.$^6$ .................................................. H01R 13/639
[52] U.S. Cl. ......................... 439/159; 439/327; 439/372; 361/801
[58] Field of Search ...................................... 439/157, 159, 439/160, 325, 327, 328, 372; 361/801, 732, 737, 740, 747, 796

[56] References Cited

U.S. PATENT DOCUMENTS 5,470,241  11/1995  Kaufman et al. ...................... 439/159
5,793,614  8/1998  Tollbom .............................. 439/327 X

*Primary Examiner*—Khiem Nguyen
*Attorney, Agent, or Firm*—Andrew J. Dillon

[57] ABSTRACT

A direct access storage device (DASD) cage holds a DASD sled which contains an electronic DASD. The sled has a base plate, side walls and a front portion. The cage has side walls and a forward panel. Each side wall of the cage has a groove for receiving an outer edge of the base plate. The front portion interfaces the DASD with a machine connector. The sled has a slidable handle and a pair of pivotable latches which engage the handle. Each latch has an inner finger and an outer finger. Each inner finger engages a slot in the handle while each outer finger moves inward and outward. Stops in the base plate limit the travel of the inner fingers. The handle is pulled rearward to a disengaged position before the sled is installed in the cage. The outer edges of the base plate are placed in the grooves and the sled is pushed forward into the cage. When the sled is half-way into the cage, the latches will partially engage the grooves to stop the movement of the sled. From this position and by pushing the handle forward, the inner fingers are pushed forward by the slots in the handle so that the outer fingers rotate into engagement with profiles in the grooves and the DASD is connected to the machine connector. The sled is removed by pulling the handle rearward so that the outer fingers disengage the profiles. As the sled is removed from the cage, the DASD simultaneously disengages the machine connector.

20 Claims, 4 Drawing Sheets

DIRECT ACCESS STORAGE DEVICE HOUSING AND TRAY DESIGN

TECHNICAL FIELD

This invention relates in general to direct access storage devices and in particular to the design of direct access storage device trays and housings.

BACKGROUND ART

Electronic hard files or direct access storage devices (DASD's) are typically mounted in a housing containing many DASD's. The DASD's may be subjected to static electricity during installation or removal, and routinely experience mechanical vibration and shock while in operation. One type of prior art device attempts to reduce the risk of damage to the DASD due to these adverse conditions by mounting the electronic DASD in a small tray prior to installation in the housing. The tray is placed within and secured to the housing with a pair of handles that lock to the housing. The tray and housing have small EMC discharge contacts which quickly discharge static electricity when they make contact. The handle and locking mechanism utilize plastic parts which slightly deform under bending stresses to adequately secure the tray from movement.

This prior art design has several potential problems. The installer is limited to visual inspection to determine if the installation or removal is properly performed. The heads on the DASD's could malfunction or be damaged by mechanical vibration or shock while the DASD's are running. Plastic deformation and creep in the plastic components of the latching mechanism due to bending stresses may cause some of the components to loosen over time. Finally, there is still a risk of electrical damage to the DASD since the EMC contacts may spark if the static electrical build up is significant.

DISCLOSURE OF THE INVENTION

A direct access storage device (DASD) cage holds a DASD sled which contains an electronic DASD. The sled has a base plate, side walls and a front portion. The cage has sides walls and a forward panel. Each side wall has a groove for receiving an outer edge of the base plate. The front portion of the sled interfaces the DASD with a machine connector. The sled has a slidable handle and a pair of pivotable latches which engage the handle. Each latch an inner finger and an outer finger. Each inner finger engages a slot in the handle while each outer finger moves inward and outward.

The handle is pulled rearward to a disengaged position before the sled is installed in the cage. The outer edges of the base plate are placed in the grooves and the sled is pushed forward into the cage. When the sled is about half-way into the cage, the latches will partially engage the grooves to stop the movement of the sled. From this position and by pushing the handle forward, the inner fingers are pushed forward by the slots in the handle so that the outer fingers rotate into engagement with profiles in the grooves and the DASD is connected to the machine connector. The sled is removed by pulling the handle rearward so that the outer fingers disengage the profiles. As the sled is removed from the cage, the DASD simultaneously disengages the machine connector.

BEST MODE FOR CARRYING OUT THE INVENTION

Figure 1:
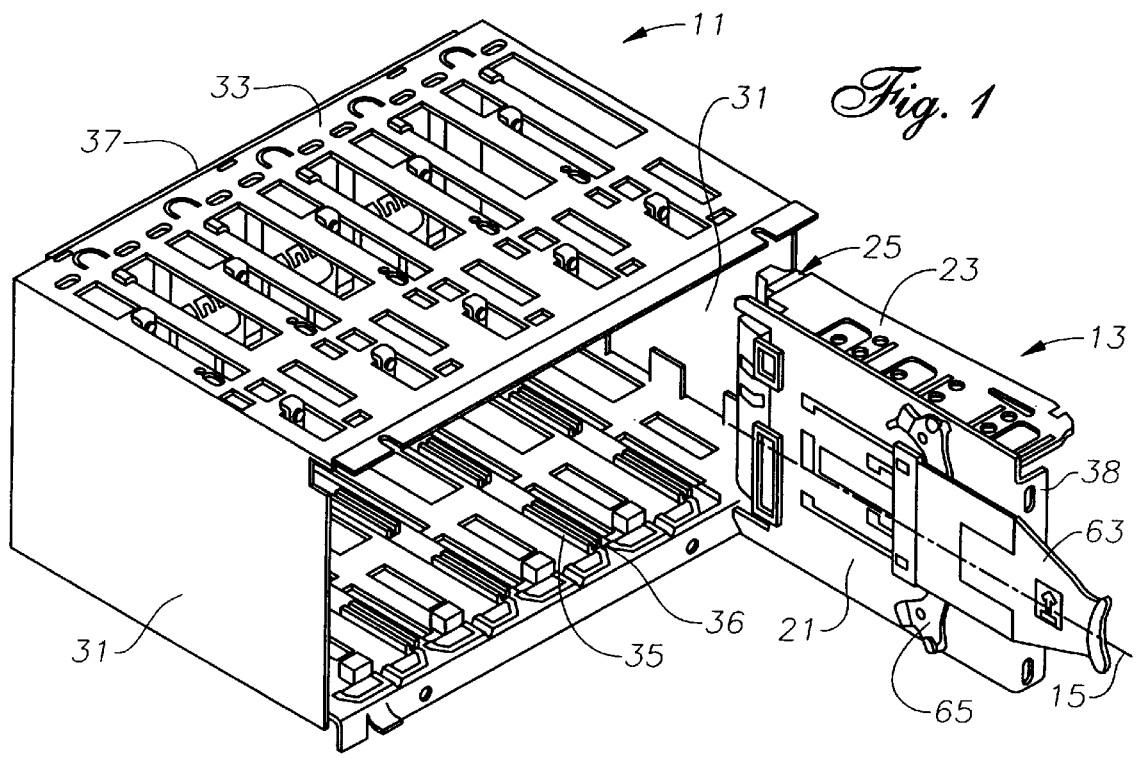
FIG. 1 is a lower rear isometric view of a direct access storage device prior to installation in a direct access storage device cage and is constructed in accordance with the invention.

Referring to FIG. 1, a direct access storage device (DASD) housing or cage 11 is provided for holding a plurality of DASD sleds 13 (only one shown) with a longitudinal axis 15. In the embodiment of FIG. 1, cage 11 may house up to five sleds 13. Each sled 13 contains one electronic DASD (not shown).

Figure 2:
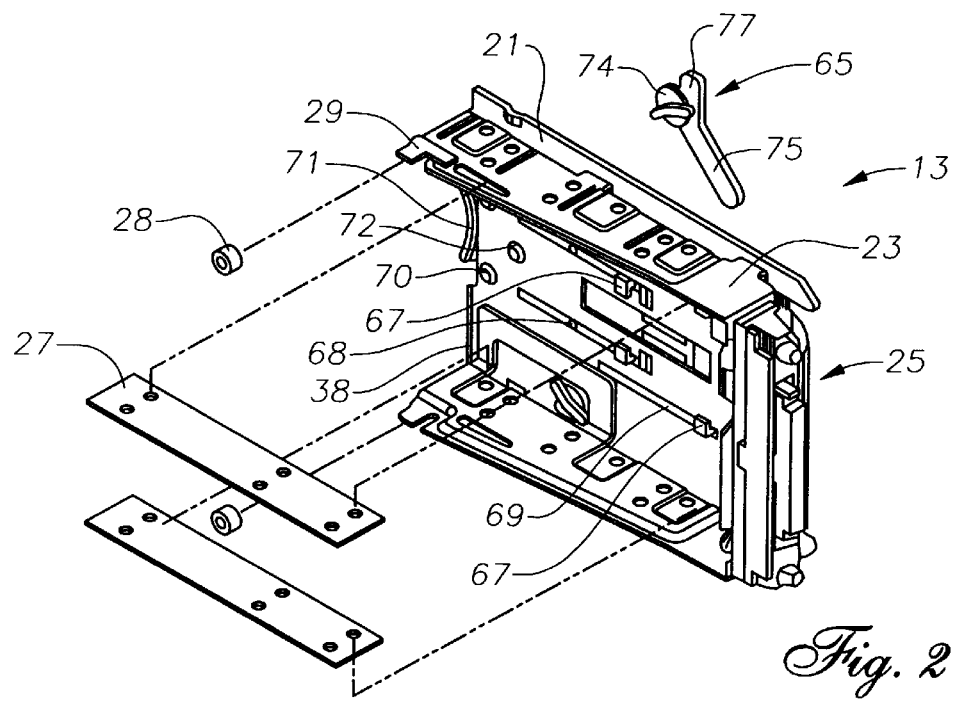
FIG. 2 is an exploded, upper front isometric view of the device of FIG. 1.
Figure 4:
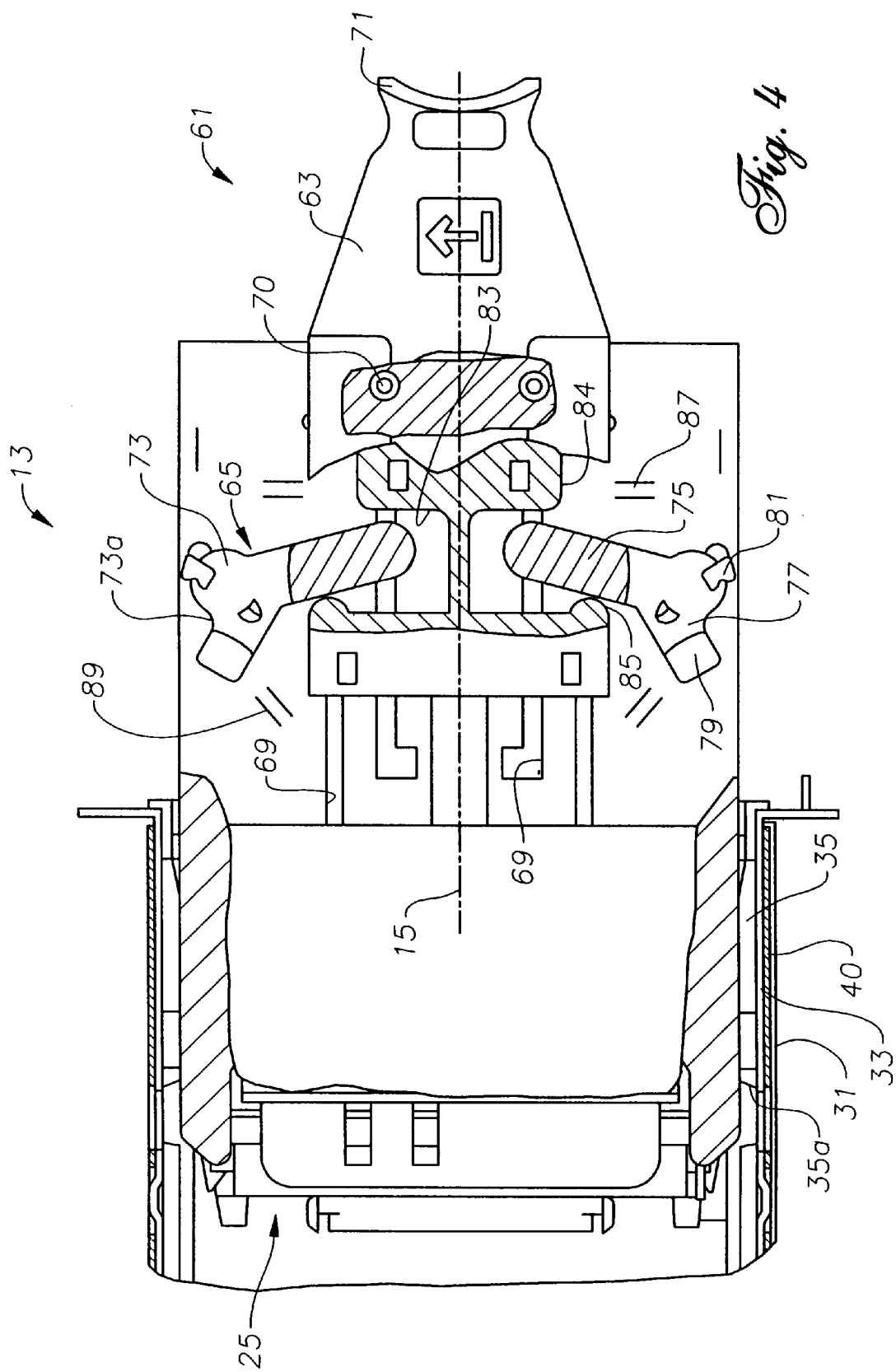
FIG. 4 is an enlarged, partially-sectioned lower view of the device of FIG. 1 partially installed in the cage of FIG. 1.
Figure 5:
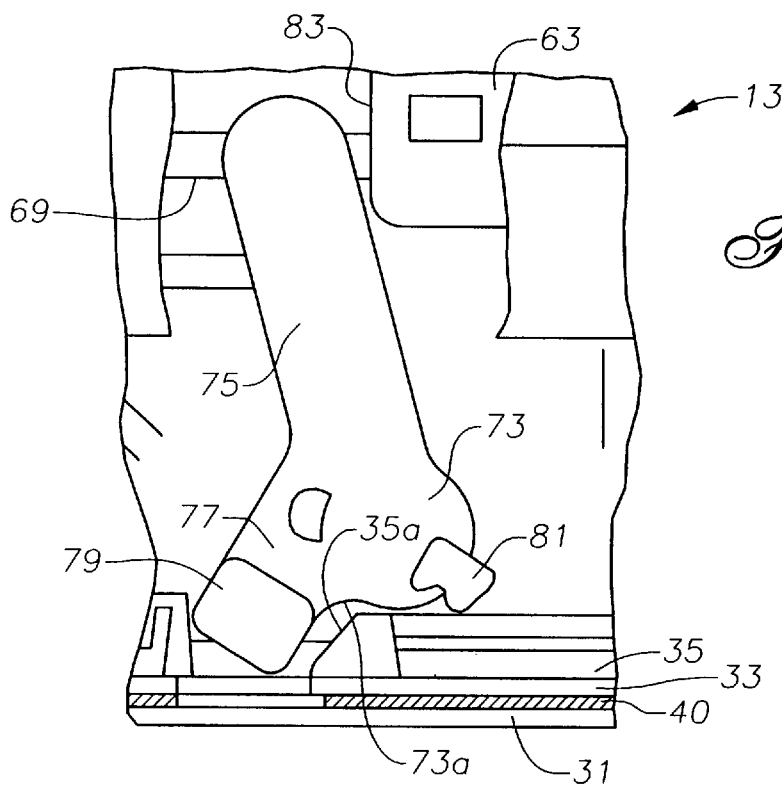
FIG. 5 is an enlarged lower view of a latch on the device of FIG. 1 as it begins to engage the cage of FIG. 1.
Figure 6:
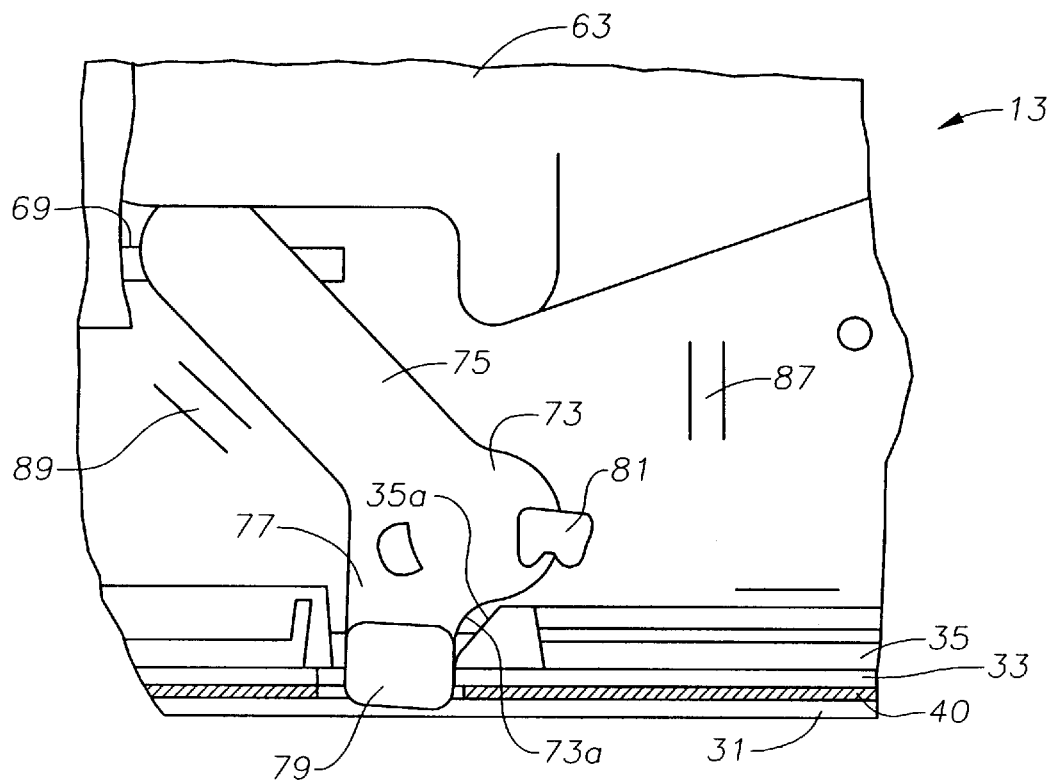
FIG. 6 is an enlarged lower view of the latch of FIG. 5 when it fully engages the cage of FIG. 1.

Referring to FIGS. 1 and 2, sled 13 has a generally rectangular structure which defines a bed with a base plate 21 having outer edges and upper and lower sides, two parallel side walls 23, each with an inner and outer side, and a front portion 25. Side walls 23 are perpendicular to base plate 21. Sled 13 is open along its upper and rearward portions. Sled 13 has a rubber dampening strip 27 attached to the inner side of each side wall 23, and a pair of rubber dampening bands 28 secured to vertical tabs 29 at upper rearward ends (FIG. 2). Cage 11 is also rectangular with upper and lower plates 31, a pair of sides walls 33 and a forward panel 37. Plates 31 are perpendicular to side walls 33. Cage 11 is open along its rearward portion 38. Each side wall 33 has a plurality of axial grooves 35 for receiving an outer edge of plate 21. Each groove 35 has a profile 35a (FIGS. 5 and 6) and contains a static discharge strip 36 (FIG. 1). As shown in FIGS. 4–6, a thin strip of constrained layer dampening material 40 is bonded to each side wall 33 for additional vibration dampening between sled 13 and cage 11.

Figure 3:
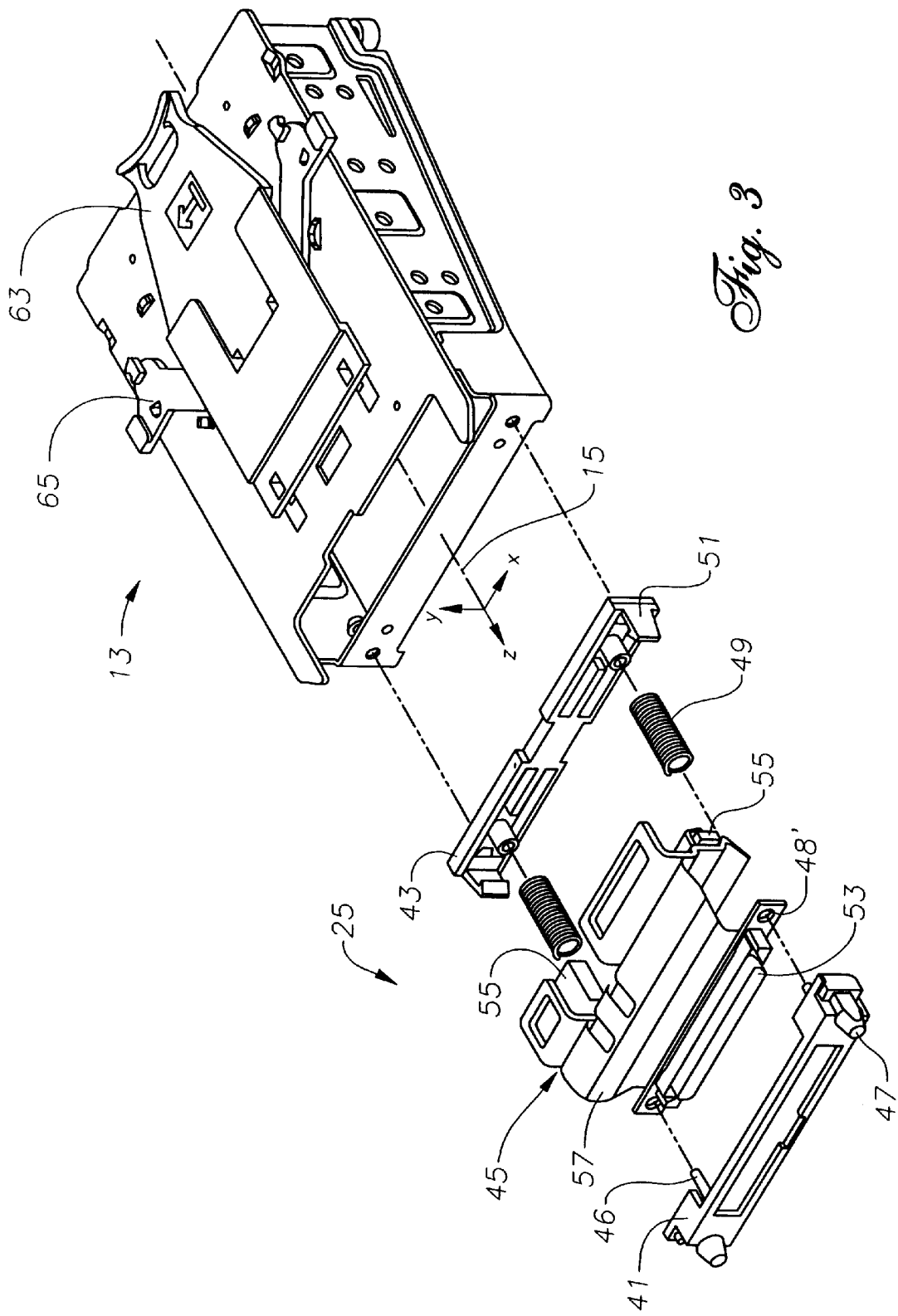
FIG. 3 is an exploded, lower front isometric view of the device of FIG. 1.

Front portion 25 is provided for interfacing the DASD with cage 11 and a male machine connector (not shown) which extends through panel 37 into cage 11. As shown in FIG. 3, front portion 25 comprises a pair of mating retaining guides 41, 43, and a connector assembly 45 sandwiched therebetween. Guide 41 has a pair of posts 46 which extend rearward to insert through holes 48 in connector assembly 45 and guide 43 to fasten front portion 25 to the forward end of sled 13. Posts 46 have a much smaller diameter than holes 48. Guide 41 also has a pair of bullet features 47 on its forward end which engage openings (not shown) in panel 37. A pair of stiff springs 49 surround posts 46 between connector assembly 45 and guide 43 for biasing connector assembly 45 in the forward direction. Guide 43 has a pair of outer locking tabs 51 which engage guide 41 to hold front portion 25 together. When assembled, guide 41 is rigidly connected to guide 43 and sled 13. Connector assembly 45 comprises a large forward-facing female connector 53 for connecting to the male machine connector, and a set of three smaller rearward-facing connectors 55 for connecting to the DASD. Connectors 53, 55 are interconnected with a flexible ribbon cable 57. When assembled and installed in sled 13, front portion 25 allows connector 53 to "float" with three degrees of freedom: a spring-biased z-directed motion along axis 15, and perpendicular x and y-directed motion (FIG. 3).

Referring now to FIGS. 2–4, sled 13 also has a plastic cage engagement mechanism 61 which is centrally mounted to the lower side of plate 21. Mechanism 61 comprises an elongated, generally planar handle 63 and a pair of opposed dogs or latches 65 which engage handle 63. Handle 63 has four upward extending tabs or fingers 67 (FIG. 2) which slidably engage a corresponding number of axial slots 69 in plate 21. Handle 63 is limited to movement along axis 15. Handle 63 has a rectangular forward portion which tapers down to a grip 71 on a rearward end. Handle 63 has a disengaged position wherein grip 71 is pulled rearward of sled 13 (FIGS. 1 and 4), and an engaged position wherein grip 71 is pushed forward and near the rearward edge of sled 13 (FIGS. 2 and 3). When handle 63 is in the disengaged position, a pair of protrusions or dimples 68 (FIG. 2) on its upper surface slidingly engage a pair of recesses depressions 70 in the lower surface of plate 21. When handle 63 is in the engaged position, a single larger dimple (not shown) on handle 63, located rearward of dimples 68, slidingly engages a depression 72 in plate 21 that is located forward of depressions 70. The dimple/depression interfaces are provided for giving the installer of sled 13 a physically detectable or tactile verification mechanism for proper engagement.

Each latch 65 has a circular hub 73 with an inner leg or finger 75 and an outer leg or finger 77 extending therefrom. Hub 73 has a circular protrusion 74 on an upper side which is closely received by and pivotally engages a hole in plate 21. Fingers 75, 77 extend from hub 73 at approximately 135 degrees relative to one another and have a much greater width than thickness. Protrusion 74 has a diameter that is greater than the width of finger 75. The distal end of finger 75 is semicircular while the distal end of finger 77 is rectangular with a boss 79 extending downward therefrom. A small cam 81 with cam profile is integrally formed along the outer edge of the lower surface of hub 73. A concave profile 73a on an outer edge of hub 73 extends between finger 77 and cam 81. Each finger 75 is located within a rectangular slot 83 on an upper surface of handle 63. Each slot 83 has a retaining shoulder 84 which is parallel to axis 15, and a semicircular shoulder 85 along an outer edge of its forward portion. When handle 63 is in the disengaged position, fingers 75 extend inward and slightly rearward while fingers 77 extend forward and slightly outward. Outer fingers 77 do not protrude past the outer edges of base plate 21 in this position. Mechanical stops 87 in plate 21 limit the rearward pivotal travel of inner fingers 75. When handle 63 is in the engaged position (FIG. 6), inner fingers 75 extend inward and forward while outer fingers 77 extend directly outward and perpendicular to axis 15. Stops 89 limit the forward pivotal travel of fingers 75 while retainer shoulders 84 limit their inner and rearward movement. There is a small clearance between fingers 75 and stops 89 when handle 63 is in the engaged position.

In operation, a DASD is placed in the bed of sled 13 between dampening strips 27. Connectors 55 are attached to those on the DASD and the DASD is secured to sled 13 with fasteners (not shown). Prior to installing sled 13 in cage 11, handle 63 is pulled rearward to the disengaged position and dimples 68 engage depressions 70. The installation sequence commences by placing front portion 25 near cage 11 and aligning the outer edges of plate 21 with a desired pair of grooves 35 in cage 11 (FIG. 1) so that side walls 23 are parallel to side walls 33.

As sled 13 is pushed forward into cage 11, grooves 35 slidably but rigidly maintain sled 13 in its planar position. The outer edges of plate 21 continuously contact discharge strips 36 in grooves 35 to slowly discharge any static electricity during installation. When sled 13 is approximately half-way into cage 11, the installer will feel or detect a mechanical "stop" wherein the forward movement of sled 13 is partially obstructed as cams 81 engage profiles 35a on grooves 35. This stop is provided as an indication to the installer that sled 13 is in the correct position to begin rotation of latches 65. From this position and by pushing handle 63 forward relative to sled 13, inner fingers 75 are pushed forward by slots 83 so that profile 73a and fingers 77 rotate about hub 73 into engagement with profiles 35a. Alternatively, sled 13 may be pushed forward without pushing handle 63 to the engaged position; the interference between latches 65 and profiles 35a will automatically rotate latches 65 into position and pull handle 63 to the engaged position. At this point, approximately four pounds of pressure is applied to each inner finger 75 by retaining shoulders 84. However, the width of fingers 75, 77 and the large diameter of protrusion 74 eliminates any potential deformation of the parts. Although fingers 77 are under a combined load of only eight pounds, a force of 300 pounds is applied to engage connector 53 and hold sled 13 securely in place when handle 63 is pushed forward to the engaged position. In the engaged position, fingers 77 protrude past the outer edges of base plate 21. As sled 13 continues its forward movement, fingers 77 are reversibly locked into profiles 35a and the single larger dimple (not shown) engages depression 72. Again, the plastic components of engagement mechanism 61 are never subjected to deformation.

As forward portion 25 approaches panel 37, bullets 47 engage the openings in panel 37 and dampening bands 28 dampen vibration between sled 13 and sides walls 33. The combination of bullets 37 and dampening bands 28 reduce twisting motion in sled 13 to a minimum while the DASD is running. Connector 53 will simultaneously engage the machine connector (not shown) extending through panel 37. Flexible cable 57 and the space between posts 46 and holes 48 allow connector 53 to float in order to accommodate any minor misalignment between connector 53 and the machine connector.

To remove sled 13 from cage 11 these steps are essentially reversed. Handle 63 is slowly pulled rearward until shoulders 85 in slots 83 engage fingers 75. Further rearward movement of handle 63 pushes fingers 75 which causes latches 65 to rotate rearward. As latches 65 rotate, profiles 73a, fingers 77 and cams 81 rotate out of engagement with profiles 35a. When handle 63 is in the fully disengaged position, sled 13 begins to smoothly slide out of cage 11. Connector 53 simultaneously disengages the machine connector as sled 13 is completely removed from cage 11.

The invention has many advantages. The use of a sled and cage isolates the DASD from mechanical and electrical damage during installation, operation and removal. The mechanical "stops" that are built into the latching mechanism give the installer tactile verification that the installation/removal is proceeding as designed. The smooth design surfaces and profiles of the interlocking mechanisms along with the bullet features and dampening materials reduce shock to and vibration of the DASD during operation. The single handle design of the sled allows it to be is installed in the cage by manipulating the handle with one hand. Creep in the plastic components of the latching mechanism is avoided since the components are never subjected to bending. Without creep, the latching mechanism will hold the same load indefinitely without relaxing. The connector interface between the DASD and the machine connector is allowed to float to accommodate for misalignment to decouple the mechanical docking forces from the connector mating forces. The static discharge strips in the cage grooves slowly dissipate static electricity to reduce the risk of electrical damage to the DASD while allowing it to plugged and unplugged into the machine while the machine is running.

While the invention has been shown or described in only some of its forms, it should be apparent to those skilled in the art that it is not so limited, but is susceptible to various changes without departing from the scope of the invention.

We claim:

1. An apparatus for connecting an electrical circuit to a machine connector, comprising:

a housing having a front panel and a pair of side walls extending rearward therefrom, each side wall having a groove and a latching profile on an inner surface;

a sled adapted to carry the circuit, the sled having a longitudinal axis and a base plate with an outer edge on each side for sliding engagement with the grooves; and a latch assembly mounted to the sled and having a handle for manual engagement and a dog on each of the sides which is operable simultaneously in response to manual movement of the handle relative to the sled, the handle having an engaged position wherein it moves both of the dogs into locking engagement with the profiles to prevent the sled from moving axially relative to the housing, and a disengaged position wherein the handle moves both of the dogs out of engagement with the profiles so that the sled may be moved axially relative to the housing.

2. The apparatus of claim 1 wherein the latch assembly is mounted to a lower surface of the base plate.

3. An apparatus for connecting an electrical circuit to a machine connector, comprising:

a housing having a front panel and a pair of side walls extending rearward therefrom, each side wall having a groove and a latching profile on an inner surface;

a sled adapted to carry the circuit, the sled having a longitudinal axis and a base plate with an outer edge on each side for sliding engagement with the grooves;

a latch assembly mounted to the sled and having a handle and a pair of dogs which are operable in response to movement of the handle, the handle having an engaged position wherein it moves the dogs into locking engagement with the profiles to prevent the sled from moving axially relative to the housing, and a disengaged position wherein the handle moves the dogs out of engagement with the profiles so that the sled may be moved axially relative to the housing; and wherein each of the dogs comprises:
an inner leg; and
an outer leg which engages the profiles of the housing;
and wherein the handle comprises:
a recess which engages the inner leg on each of the dogs for moving the dogs into and out of engagement with the profiles.

4. The apparatus of claim 1 wherein the dogs are pivotally mounted to the base plate adjacent to the outer edges.

5. The apparatus of claim 1 wherein the handle is slidably mounted to a lower side of the base plate; and wherein the dogs are pivotally mounted to the base plate adjacent to the outer edges.

6. An apparatus for connecting an electrical circuit to a machine connector, comprising:

a housing having a front panel and a pair of side walls extending rearward therefrom, each side wall having a groove and a latching profile on an inner surface;

a sled adapted to carry the circuit, the sled having a longitudinal axis and a base plate with an outer edge on each side for sliding engagement with the grooves;

a latch assembly mounted to the sled and having a handle and a pair of dogs which are operable in response to movement of the handle, the handle having an engaged position wherein it moves the dogs into locking engagement with the profiles to prevent the sled from moving axially relative to the housing, and a disengaged position wherein the handle moves the dogs out of engagement with the profiles so that the sled may be moved axially relative to the housing; and wherein the sled has sidewalls extending perpendicularly upward from the base plate; and wherein the apparatus further comprises:

a dampening strip mounted to an inner surface of each of the side walls of the sled for dampening mechanical vibration and shock to the circuit; and dampening elements mounted between the sled and the housing for dampening mechanical vibration and shock to the sled.

7. An apparatus for connecting an electrical circuit to a machine connector, comprising:

a housing having a front panel and a pair of side walls extending rearward therefrom, each side wall having a groove and a latching profile on an inner surface;

a sled adapted to carry the circuit, the sled having a longitudinal axis and a base plate with an outer edge on each side for sliding engagement with the grooves;

a latch assembly mounted to the sled and having a handle and a pair of dogs which are operable in response to movement of the handle, the handle having an engaged position wherein it moves the dogs into locking engagement with the profiles to prevent the sled from moving axially relative to the housing, and a disengaged position wherein the handle moves the dogs out of engagement with the profiles so that the sled may be moved axially relative to the housing; and static discharge strips mounted between the sled and the grooves of the housing for slowly discharging static electricity therebetween.

8. The apparatus of claim 1, further comprising a connector assembly mounted to the sled for interconnecting the circuit to the machine connector.

9. An apparatus for connecting an electrical circuit to a machine connector, comprising:

a housing having a front panel and a pair of side walls extending rearward therefrom, each side wall having a groove and a latching profile on an inner surface;

a sled adapted to carry the circuit, the sled having a longitudinal axis and a base plate with an outer edge on each side for sliding engagement with the grooves;

a latch assembly mounted to the sled and having a handle and a pair of dogs which are operable in response to movement of the handle, the handle having an engaged position wherein it moves the dogs into locking engagement with the profiles to prevent the sled from moving axially relative to the housing, and a disengaged position wherein the handle moves the dogs out of engagement with the profiles so that the sled may be moved axially relative to the housing;

a recess in the handle;

a pair of retaining shoulders in the recess extending parallel to the axis so that an inner leg of each of the dogs slides out of the recess and onto an adjacent retaining shoulder after the dog is in the locked position; and wherein each of the retaining shoulders applies a force to an adjacent inner leg without deforming the adjacent inner leg while it is in the locked position, the force being substantially greater than a force which is required to remove the sled from the housing while the inner legs are in the locked position.

10. The apparatus of claim 1, further comprising:

a protuberance on one of the sled and the handle; and a recess on the other of the sled and the handle for receiving the protuberance and partially obstructing the movement of the handle, the protuberance and the recess providing a tactile indication of the position of the handle relative to the housing.

11. The apparatus of claim 1, further comprising a strip of dampening material located on each side wall of the housing adjacent to the groove.

12. An apparatus for connecting an electrical circuit to a machine connector, comprising:

a housing having a front panel and a side wall extending rearward therefrom, the side wall having a groove and a latching profile on an inner surface;

a sled adapted to carry the circuit, the sled having a longitudinal axis and a base plate with an outer edge for sliding engagement with the groove;

a connector assembly mounted to the sled for interconnecting the circuit to the machine connector;

a latch plate slidably mounted to and parallel with the base plate, the latch plate having a locked position and a released position;

a dog pivotally mounted to the base plate adjacent to the outer edge and having an outer leg which protrudes past the outer edge and into the profile when the latch plate is in the locked position and which retracts within the outer edge when the latch plate is in the released position;

an inner leg on the dog; and a recess in the latch plate which pushes the inner leg to a retaining position when the latch plate is pushed to the locked position, and to an unrestrained position when the latch plate is pushed to the released position.

13. The apparatus of claim 12 wherein the recess comprises a retaining shoulder extending parallel to the outer edge, the inner leg sliding out of the recess and onto the retaining shoulder after the outer leg engages the profile; and wherein the retaining shoulder applies a force to the inner leg without deforming the inner leg while it is in the locked position, the force being substantially greater than a force which is required to remove the sled from the housing while the inner leg is in the locked position.

14. The apparatus of claim 12 wherein the connector assembly comprises:

a retaining guide mounted to the front end of the sled; and a connector located within the retaining guide, the connector being free to float vertically and horizontally relative to the retaining guide; and wherein the connector is biased axially forward by a pair of springs located between the connector and the front end of the housing.

15. The apparatus of claim 12 wherein the connector assembly comprises:

a forward retaining guide having a slot;

a rearward retaining guide;

a connector for connecting to the machine connector, the connector extending through and being dimensioned smaller than the slot in the forward retaining guide; and a pair of springs located between the connector and the rearward retaining guide for biasing the connector in the forward direction.

16. The apparatus of claim 12 wherein the sled has a pair of sidewalls extending perpendicularly upward from the base plate; and wherein the apparatus further comprises:

a dampening strip mounted to an inner surface of each of the side walls of the sled for dampening mechanical vibration and shock to the circuit; and dampening elements mounted between the sled and the housing for dampening mechanical vibration and shock to the sled.

17. The apparatus of claim 12, further comprising:

a protuberance on one of the sled and the latch plate; and a recess on the other of the sled and the latch plate for receiving the protuberance and partially obstructing the movement of the latch plate, the protuberance and the recess providing a tactile indication of the position of the latch plate relative to the housing.

18. The apparatus of claim 12, further comprising a strip of dampening material located on the side wall of the housing adjacent to the groove.

19. An apparatus for connecting an electrical circuit to a machine connector, comprising:

a housing having a front panel and a pair of side walls extending rearward therefrom, each of the side walls having a groove and a latching profile on an inner surface;

a sled adapted to carry the circuit, the sled having a longitudinal axis and a base plate with a pair of outer edges for sliding engagement with the grooves;

a connector assembly mounted on a front end of the sled for interconnecting the circuit to the machine connector;

a latch plate slidably mounted to and parallel with the base plate, the latch plate having a locked position and a released position;

a pair of dogs pivotally mounted to the base plate adjacent to the outer edges, each of the dogs having an outer leg which protrudes past one of the outer edges and into one of the profiles when the latch plate is in the locked position, and which retracts within one of the outer edges and out of one of the profiles when the latch plate is in the released position;

an inner leg on each of the dogs; and a recess in the latch plate for each of the inner legs, each of the recesses having a shoulder which pushes the inner leg to a retaining position when the latch plate is pushed to the locked position, and to a retracted position when the latch plate is pushed to the released position.

20. The apparatus of claim 19 wherein the recess comprises a pair of retaining shoulders extending parallel to the axis so that the inner leg of each of the dogs slides out of the recess and onto an adjacent retaining shoulder after the dog is in the locked position; and wherein each of the retaining shoulders applies a force to an adjacent inner leg without deforming the adjacent inner leg while it is in the locked position, the force being substantially greater than a force which is required to remove the sled from the housing while the inner legs are in the locked position.

* * * * *